United States Patent [19]

Morita et al.

[11] Patent Number: 4,839,232

[45] Date of Patent: Jun. 13, 1989

[54] FLEXIBLE LAMINATE PRINTED-CIRCUIT BOARD AND METHODS OF MAKING SAME

[75] Inventors: Moritsugu Morita, Yokosuka; Kazuo Miyazaki, Yokohama; Akihiro Yamaguchi, Kamakura; Masahiro Ohta, Yokohama; Shoji Tamai, Yokohama; Kunio Nishihara, Yokohama, all of Japan

[73] Assignee: Mitsui Toatsu Chemicals, Incorporated, Tokyo, Japan

[21] Appl. No.: 69,449

[22] PCT Filed: Oct. 31, 1986

[86] PCT No.: PCT/JP86/00554

§ 371 Date: Jun. 25, 1987

§ 102(e) Date: Jun. 25, 1987

[87] PCT Pub. No.: WO87/02620

PCT Pub. Date: May 7, 1987

[30] Foreign Application Priority Data

Oct. 31, 1985 [JP] Japan .................. 60-242935
Oct. 29, 1986 [JP] Japan .................. 61-255908

[51] Int. Cl.⁴ .......... B32B 3/00; B32B 27/00; B32B 31/00; B05D 5/12
[52] U.S. Cl. .................. 428/473.5; 428/209; 428/901; 428/458; 427/96; 156/228; 156/233
[58] Field of Search ............ 428/209, 473.5, 901, 428/458; 156/228, 233; 427/96; 260/404.8, 424, 546

[56] References Cited

U.S. PATENT DOCUMENTS

| | | | |
|---|---|---|---|
| 3,179,634 | 4/1965 | Edwards | 428/290 |
| 3,666,709 | 5/1972 | Suzuki et al. | 260/33.4 P |
| 4,411,952 | 10/1983 | Sasaki et al. | 428/473.5 |
| 4,508,766 | 4/1985 | Inaike et al. | 427/96 |
| 4,528,833 | 7/1985 | Inaike et al. | 72/166 |
| 4,690,999 | 9/1987 | Numata et al. | 528/188 |

FOREIGN PATENT DOCUMENTS

| | | |
|---|---|---|
| 129862 | 12/1974 | Japan . |
| 115888 | 9/1977 | Japan . |
| 190092 | 11/1983 | Japan . |
| 210894 | 4/1984 | Japan . |

OTHER PUBLICATIONS

Chemical Abstracts 104:187094q.
Chemical Abstracts 104:111010p.

*Primary Examiner*—Ellis P. Robinson
*Assistant Examiner*—P. J. Ryan
*Attorney, Agent, or Firm*—Fisher, Christen & Sabol

[57] ABSTRACT

A polyimide film formed by using a symmetrical aromatic meta-substituted primary diamine and a symmetrical aromatic para-substituted primary diamine as raw materials in a specific proportion has excellent heat resistance, electrical properties, flexibility and the like. Such a polyimide film can be bonded to a metal foil not by using any adhesive, but by coating the metal foil with a polyamic acid constituting a precursor of the polyimide and further reacting the polyamic acid to convert it to the polyimide. In this manner, there can be obtained a flexible laminate for printed-circuit board comprising a polyimide film bonded to a metal foil with good adhesion and exhibiting excellent properties as described above.

14 Claims, No Drawings

FLEXIBLE LAMINATE PRINTED-CIRCUIT BOARD AND METHODS OF MAKING SAME

TECHNICAL FIELD

This invention relates to a flexible laminate for printed-circuit board comprising a metal-clad polyimide sheet having excellent heat resistance, electrical properties and mechanical properties, as well as methods of making the same.

BACKGROUND ART

Flexible laminate for printed-circuit boards are materials for the fabrication of printed circuits having flexibility, and their use is increasing in recent years, for example, because the cases for containing printed circuits are being reduced in size. Conventionally, such flexible laminate for printed-circuit boards have been made by bonding a polyimide film to copper foil with the aid of an adhesive. In such boards, the polyimide film has satisfactorily good heat resistance, electrical properties and mechanical properties, but the adhesive has inadequate properties. For this reason, they have had the disadvantage that the good properties of the polyimide film are not fully utilized.

Accordingly, attempts have been made in the prior art to form a flexible laminate for printed-circuit board comprising a metal-clad polyimide sheet, without the aid of an adhesive. Some examples are disclosed in U.S. Pat. No. 3,179,634, Japanese Patent Laid-Open Nos. 129862/'74, 190091/'83 and 190092/'83, and the like. However, a flexible laminate for printed-circuit board having a combination of adequate heat resistance, adhesion strength and flexibility has not yet been provided.

DISCLOSURE OF THE INVENTION

The present invention has been made in view of the above-described problems, and it is an object thereof to provide a flexible laminate for printed-circuit board comprising a metal-clad polyimide sheet having a combination of excellent heat resistance, electrical properties, and mechanical properties such as adhesion strength, flexibility, etc., as well as methods of making the same.

The present invention is concerned with a method of making a flexible laminate for printed-circuit board which comprises the steps of mixing a symmetrical aromatic meta-substituted primary diamine with a symmetrical aromatic para-substituted primary diamine in an equivalent weight ratio of 10–60:90–40, reacting the resulting mixture with an aromatic tetracarboxylic acid anhydride to form a polyamic acid as a polyimide precursor, coating a metal foil directly with the resulting organic solvent solution of said polyamic acid, and then heating the coated metal foil to dehydrate said polyamic acid; a method of making a flexible laminate for printed-circuit board which comprises the steps of reacting a symmetrical aromatic meta-substituted primary diamine with an aromatic tetracarboxylic acid anhydride to form a polyamic acid (A), reacting a symmetrical aromatic para-substituted primary diamine with an aromatic tetracarboxylic acid anhydride to form a polyamic acid (B), mixing the resulting organic solvent solution of said polyamic acid (A) with the resulting organic solvent solution of said polyamic acid (B) in an equivalent weight ratio of 10–60:90–40, coating a metal foil directly with the resulting mixture, and then heating the coated metal foil to dehydrate said polyamic acids; and flexible laminate for printed-circuit boards made by these methods.

BEST MODE FOR CARRYING OUT THE INVENTION

A flexible laminate for printed-circuit board having more excellent properties is obtained when the aforesaid step of heating the coated metal foil to dehydrate said polyamic acid(s) is carried out in an atmosphere of an inert gas. A flexible laminate for printed-circuit board can be relatively simply and economically made by coating a metal foil directly with the resulting organic solvent solution of the polyamic acid(s), drying the resulting laminate to a substantially tack-free state, rolling up the laminate, and then heating the rolled laminate in an atmosphere of an inert gas to dehydrate the polyamic acid(s).

The symmetrical aromatic meta-substituted primary diamines (hereinafter referred to briefly as m-diamines) useful in the present invention can be represented by the general formulas:

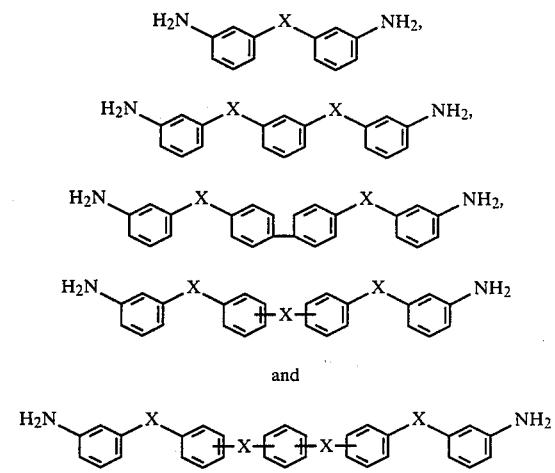

and

Wherein X is selected from the group consisting of O, $SO_2$, S, CO, $CH_2$, $C(CH_3)_2$ and $C(CF_3)_2$, and the radicals represented by X can be the same.

Examples of the m-diamines represented by the above general formulas include 3,3'-diaminodiphenyl ether, 3,3'-diaminodiphenyl sulfide, 3,3'-diaminodiphenyl sulfone, 3,3'-diaminobenzophenone, bis[4-(3-aminophenoxy)-phenyl]methane, 2,2-bis[4-(3-aminophenoxy)-phenyl]propane, 2,2-bis[4-(3-aminophenoxy)phenyl]-1,1-1,3,3,3-hexafluoropropane, 1,3-bis(3-aminophenoxy)benzene, 4,4'-bis (3-aminophenoxy)biphenyl, bis[4-(3-aminophenoxy)phenyl]ketone, bis [4-(3-aminophenoxy)phenyl]sulfide, bis[4-(3-aminophenoxy)phenyl]sulfone, bis[4-(3-aminophenoxy)phenyl]ether, 4,4'-bis(3-aminophenylsulfonyl(diphenyl ether, 4,4'-bis(3-aminothiophenoxy)diphenyl sulfone, 1,4-bis[4-(3-aminophenoxy)benzoyl]benzene and the like. These m-diamines can be used alone or in an admixture of two or more.

The symmetrical aromatic para-substituted primary diamines (hereinafter referred to briefly as p-diamines) can be represented by the general formulas

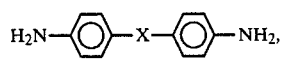

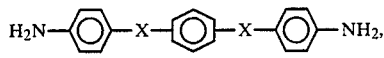

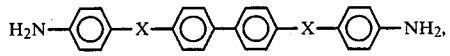

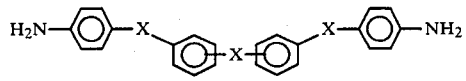

and

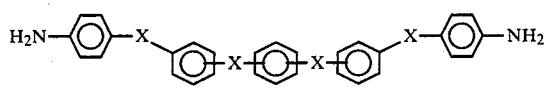

wherein X is selected fdrom the group consisting of O, SO$_2$, S, CO, CH$_2$, C(CH$_3$)$_2$ and C(CF$_3$)$_2$, and the radicals represented by X can be the same or different.

Examples of the p-diamines represented by the above general formulas include 4,4'-diaminodiphenyl ether, 4,4'-diaminodiphenyl sulfide, 4,4'-diaminodiphenyl sulfone, 4,4'-diaminobenzophenone, bis[4-(4-aminophenoxy)phenyl]methane, 2,2-bis[4-(4aminophenoxy)phenyl]propane, 2,2-bis[4-(4-aminophenoxy)phenyl]-1,1-1,3,3,3-hexafluoropropane, 1,3-bis(4-aminophenoxy)benzene, 4,4'-bis(4-aminophenoxy)biphenyl, bis[4-(4-aminophenoxy)phenyl]ketone, bis[4-(4-aminophenoxy)phenyl]sulfide, bis[4-(4-aminophenoxy)phenyl]sulfone, bis[4-(4-aminophenoxy)-phenyl]ether, 4,4'-bis(4-aminophenylsulfonyl)diphenyl ether, 4,4'-bis(4-aminothiophenoxy)diphenyl sulfone, 1,4-bis[4-(4-aminophenoxy)benzoyl]benzene and the like. These p-diamines can be used alone or in an admixture of two or more.

As the aromatic tetracarboxylic acid anhydride reacted with the above-defined diamines, there can be used pyromellitic acid dianhydride, 3,3',4,4'-benzophenonetetracarboxylic acid dianhydride, 2,2',3,3'-benzophenonetetracarboxylic acid dianhydride, 3,3',4,4'-biphenyltetracarboxylic acid dianhydride, 2,2',3,3'-biphenyltetracarboxylic acid dianhydride, 2,2-bis(3,4-dicarboxyphenyl)propane dianhydride, 2,2-bis(2,3-dicarboxyphenyl)propane dianyhydride, bis(3,4-dicarboxyphenyl) ether dianhydride, bis(3,4-dicarboxyphenyl) sulfone dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 2,386,7-naphthalenetetracarboxylic acid dianhydride, 1,4,5,8-naphthalenetetracarboxylic acid dianhydride, 1,2,5,6-naphthalenetetracarboxylic acid dianhydride, 1,2,3,4-benzenetetracarboxylic acid dianhydride, 3,4,9,10-perylenetetracarboxylic acid dianhydride, 2,3,6,7-anthracenetetracarboxylic acid dianhydride, 1,2,7,8-phenanthrenetetracarboxylic acid dianhydride and the like. These tetracarboxylic acid anhydrides can be used alone or in an admixture of two or more.

The organic solvents which can be used for polymerization and coating purposes include, for example, N-methyl-2-pyrrolidone, N,N-dimethylacetamide, N,N-dimethylformamide, 1,3-dimethyl-2-imidazolidinone, N,N-diethylacetamide, N,N-dimethylmethoxyacetamide, dimethyl sulfoxide, pyridine, dimethyl sulfone, hexamethylphosphoramide, tetramethylurea, N-methylcaprolactam, tetrahydrofuran, m-dioxane, p-dioxane, 1,2-dimethoxyethane, bis(2-methoxyethyl)ether, 1,2-bis(2-methoxyethoxy)ethane, bis[2-(2-methoxyethoxy)ethyl] ether and the like.

The polyamic acid used in the present invention is formed by mixing a m-diamine with a p-diamine in an organic solvent at a temperature of generally −20° to 100° C., preferably 0° C. to 40° C., in an equivalent weight ratio of m-diamine to p-diamine of 0.1–0.6:0-.9–0.4, preferably 0.2–0.4:0.8–0.6, and then reacting the resulting mixture with an aromatic tetracarboxylic acid anhydride at a temperature ranging from −20° to less than the boiling point of the solvent used, preferably from 0° to 40° C., for a period of not less than 10 minutes, preferably 1 to 48 hours (Method 1); or by reacting a m-diamine with an aromatic tetracarboxylic acid anhydride at a temperature ranging from −20° to less than the boiling point of the solvent used, preferably from 0° to 40°C., for a period of not less than 10 minutes, preferably 1 to 48 hours, to form a polyamic acid (A), reacting a p-diamine with an aromatic tetracarboxylic acid anhydride under the same conditions and in the same manner as described for the polyamic acid (A) to form a polyamic acid (B), and then mixing the polyamic acid (A) with the polyamic acid (B) in an equivalent weight ratio of 0.1–0.6:0.9–0.4, preferably 0.2–0.4:0.8–0.6, as expressed in terms of the diamines contained therein (Method 2). The polyamic acid solution obtained in the above-described manner should preferably have a polyamic acid concentration of 5 to 50 percent. Of two methods, Method 1 can produce especially preferable results from the viewpoint of mechanical properties and the like. If the equivalent weight ratio of the m-diamine is higher than 60 percent, the formed polyimide will have a high degree of thermoplasticity and the resulting laminate for printed-circuit board will have the disadvantage of being hard to handle. Specifically, the appearance of such a laminate for printed-circuit board tends to be inpaired because the polyimide film may be easily damaged on direct contact with a soldering iron (300°–350° C.), or may be deformed when the board is floated on a hot solder bath (280° C. or above). If the equivalent weight ratio of the m-diamine is lower than 10 percent, the resulting polyimide film will have poor adhesion to the metal foil. Such a laminate for printed-circuit board will be unsuitable for practical purposes because the flexible laminate for printed circuit fabricated thereof may be easily peeled from the film.

Among various combinations of diamines useful in the formation of polyamic acids, especially preferred m-diamines are the compounds represented by the formula

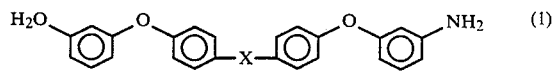

where X is O, SO$_2$, S, CO, CH$_2$, C(CH$_3$)$_2$, C(CF$_3$)$_2$ or a direct bond. On the other hand, especially preferred p-diamines are 4,4'-diaminodiphenyl ether and/or 4,4'-bis(4-aminophenoxy)biphenyl. Moreover, especially preferred aromatic tetracarboxylic acid anhydrides are pyromellitic acid dianhydride and/or 3,3',4,4'-benzophenonetetracarboxylic acid dianhydride. The use of these preferred compounds makes it possible to yield flexible laminate for printed-circuit boards having excellent heat resistance, electrical properties, and mechanical properties such as adhesion strength, flexibility, etc.

Then, a metal foil is coated with the resulting polyamic acid solution. For this purpose, the resulting polyamic acid can be used directly or after being diluted with an organic solvent as described above. Judging from the properties of the formed polyimide, the application properties of the polyamic acid, and the economy of the drying step, it is preferable to use a polyamic acid solution containing the polyamic acid in an amount of 5 to 40 percent by weight, more preferably 10 to 30 percent by weight, and having an inherent viscosity (as measured by a 0.5 g/100 ml solution in N,N-dimethylacetamide at 35° C.) of 0.5 to 6 dl/g, more preferably 0.1 to 4 dl/g. As a simpler means, the viscosity of the polyamic acid can be roughly estimated by use of a rotational viscometer at the time of application. In this case, the preferred range is from 100 to 500,000 cps.

Generally, the metal foil to be coated with the polyamic acid is copper foil or aluminum foil. However, other electrically-conductive metal foils such as nickel foil and the like can also be used.

The step of coating the metal foil with the polyamic acid solution is preferably carried out by casting. Specifically, the polyamic acid solution is extruded through a film-forming slit and spread on the surface of the metal foil to form a coating film layer having a uniform thickness. The thickness of the coating film layer should be adjusted so that the finally obtained polyimide film layer will have a thickness of the order of 10 to 1000 $\mu$m. If the thickness is less than 10 $\mu$m, the flexible printed-circuit board will not have adequate strength, and if it is greater than 1000 $\mu$m, the board will lack in flexibility. In order to obtain a polyimide film layer having such a thickness, the polyamic acid solution should usually be applied to a thickness of 30 to 3000 $\mu$m.

It is also possible to use other well-known coating means, such as roll coaters, knife coaters, other well-known.

The polyamic acid coating film layer formed in the above-described manner is then heated to remove the solvent therefrom and condense the polyamic acid with the elimination of water. This step can be carried out under any of various conditions including atmospheric, subatmospheric and supra-atmospheric pressures. The heating method can be hot-air heating, infrared heating, far infrared heating or the like, and these heating means may also be used in combination. Generally, the coated metal foil is heated at a temperature of 100° to 200° C., preferably 100° to 150°C., for a period of usually 3 to 600 minutes, preferably 4 to 180 minutes and more preferably 5 to 60 minutes, to remove most of the solvent. Then, it is further heated at a temperature of 180° to 350° C. for a period of 2 to 600 minutes, preferably 3 to 180 minutes and more preferably 5 to 120 minutes, to remove the solvent completely and convert the polyamic acid to a stabler polyimide. If the coated metal foil is exposed, during this solvent removal and dehydration step, to a temperature equal to or higher than that at which the surfaces of the metal foil are oxidized, the mechanical properties, electrical properties and adhesion strength of the metal foil will tend to be reduced because of the oxidation of the metal foil surfaces. Accordingly, at temperatures equal to or higher than that at which the surfaces of the metal foil are oxidized, it is especially preferable for the prevention of oxidation of the metal foil surfaces to carry out the solvent removal and dehydration step in an atmosphere of an inert gas such as nitrogen, helium, neon, argon or the like. The term "inert gas" as used herein means a gaseous atmosphere in which, when the metal foil is heated for a predetermined period of time, its surfaces undergo no substantial oxidation reaction exerting an adverse influence on its electirical properties or adhesion strength. Usually, the term "inert gas" means a gaseous atmosphere having an oxygen content of not greater than 10 percent, preferably not greater than 6 percent and more preferably not greater than 4 percent, though it depends on the heating temperature.

The aforesaid heating and drying step is generally carried out while the coated metal foil is spread out. According to the present invention, however, a metal foil can be directly coated with the organic solvent solution of the polyamic acid, dry the resulting laminate to a substantially tack-free state (until the solvent content of the coating film layer is not greater than 40 percent by weight), roll up the laminate, and heating the rolled laminate in an atmosphere of an inert gas to remove the solvent therefrom and dehydrate the polyamic acid.

The flexible printed-circuit boards comprising metal-clad polyimide sheets made by the above-described methods of the present invention have excellent heat resistance, electrical properties and mechanical properties because of the lack of an adhesive layer and the use of an excellent polyimide.

Since the flexible laminate for printed-circuit boards of the present invention are made by laminating a polyimide film directly, or without the aid of an adhesive, to a metal foil such as copper foil or the like, they exhibit a combination of excellent heat resistance, electrical properties, and mechanical properties such as adhesion strength, flexibility, etc., which has never been achievable in the prior art. Thus, they are very useful in the fabrication of electrical circuits requiring higher degrees of heat resistance, electrical insulating properties, dielectric properties, adhesion strength and folding endurance.

EXAMPLES

The present invention and the effects thereof will be more specifically explained with reference to the following Examples and Comparative Examples.

In these examples, inherent viscosity was measured by a 0.5 g /100 ml solution in N,N-dimethylacetamide at 35° C., and rotational viscosity was measured at 25° C. using the high-viscosity rotor of an E type viscometer. Various performance characteristics of laminate for printed-circuit boards were determined according to the procedure described below.

(1) Foil peeling strength
Foil peeling strength was determined according to the procedure of IPC-FC-241A.

(2) Surface resistance
Surface resistance was measured according JIS C-6481.

(3) Resistance to soldering
Resistance to soldering was determined according to JIS C-6481. Specifically, a specimen was dipped in a solder bath at 280° C. for 60 seconds, and then examined for "the occurrence of the blisters" and "the deformation of the polyimide film".

(4) Resistance to manual soldering
A soldering iron having a tip with a radius of curvature of 0.5 mm and a taper angle of 30° was used and controlled so that a load of 100 g would be applied on the tip. After the tip temperature was adjusted to 325°±25° C., the soldering iron was allowed to stand upright on a film (25 μm thick) consisting of polyimide alone. Its resistance to manual soldering was rated as good (O) when the film remained intact for more than 5 seconds after being brought into contact with the soldering iron, and as poor (X) when the film was broken within 5 seconds.

(5) Folding endurance

According to JIS P-8115, folding endurance was determined under such conditions that the folded surface had a radius of curvature of 0.8 mm and underwent a static load of 500 g.

(6) Dielectric constant and dielectric dissipation factor

According to JIS C-6481, dielectric constant and dielectric dissipation factor were measured at a frequency of 1 kHz.

EXAMPLE 1

In a vessel fitted with a stirrer, a reflux condenser and a nitrogen inlet tube, 23.4 g (0.08 mole) of 1,3-bis(3-aminophenoxy)benzene and 24.0 g (0.12 mole) of 4,4'-diaminodiphenyl ether were dissolved in 420 ml of N,N-dimethylacetamide. To this solution was added 64.4 g (0.20 mole) of 3,3',4,4'-benzophenonetetracarboxylic acid dianhydride under an atmosphere of nitrogen. The resulting mixture was stirred at 10° C. for 24 hours to obtain a polyamic acid solution. The polyamic acid solution thus obtained had an inherent viscosity of 1.5 dl/g. This polyamic acid solution was diluted with N,N-dimethylacetamide to a polyamic acid concentration of 15% so as to adjust its viscosity to 25,000 cps. Then, using a doctor blade, a rolled copper foil (35 μm thick) was uniformly coated with the diluted solution. This coated copper foil was dried by heating at 130° C. for 60 minutes, and then heated in an atmosphere of nitrogen (with an oxygen concentration of 4%) at 260° C. for 60 minutes to obtain a polyimidecoated copper foil. The film thickness was 25 μm. The characteristics of the laminate for printed-circuit board thus obtained were as shown in Table 1.

EXAMPLE 2

In a vessel fitted with a stirrer, a reflux condenser and a nitrogen inlet tube, 22.1 g (0.06 mole) of 4,4'-bis(3-aminophenoxy)biphenyl and 28.0 g (0.14 mole) of 4,4'-diaminodiphenyl ether were dissolved in 350 ml of N,N-dimethylacetamide. After this solution was cooled to about 0° C., 43.6 g (0.20 mole) of pyromellitic acid dianhydride was added thereto under an atmosphere of nitrogen, and the resulting mixture was stirred at about 0° C. for 2 hours. Then, the mixture was returned to room temperature and stirred for about 20 hours under an atmosphere of nitrogen. The polyamic acid solution thus obtained had an inherent viscosity of 1.7 dl/g. This polyamic acid solution was diluted with N,N-dimethylacetamide to a polyamic acid concentration of 19% so as to adjust its rotational viscosity to 120,000 cps.

Then, according to a casting technique, this solution was uniformly applied to a rolled copper foil (35 μm thick). After the coated copper foil was dried by heating at 130° C. for 10 minutes and then at 160° C. for 10 minutes, it was further heated in an atmosphere of nitrogen (with an oxygen concentration of 3%) at 270° C. for 10 minutes to obtain a polyimide-coated copper foil. The film thickness was 25 μm. The characteristics of the laminate for printed-circuit board thus obtained were as shown in Table 1.

EXAMPLE 3

A polyimide-coated copper foil was obtained in the same manner as described in Example 2, except that an oxygen concentration of 8% was used when the coated copper foil was dried at 270° C. The characteristics of the laminate for printed-circuit board thus obtained were as shown in Table 1.

EXAMPLES 4

A polyamic acid solution was prepared in the same manner as described in Example 2, ecept that 51.6 g (0.14 mole) of 4,4'-bis(4-aminophenoxy)biphenyl was used in place of 28.0 g of 4,4'-diaminodiphenyl ether. The polyamic acid solution thus obtained had an inherent viscosity of 1.6 dl/g. This polyamic acid solution was diluted with N,N-dimethylacetamide to a polyamic acid concentration of 18% so as to adjust its rotational viscosity to 105,000 cps.

Then, according to a casting technique, this solution was uniformly applied to a rolled copper foil (35 μm thick). After the coated copper foil was dried by heating at 130° C. for 20 minutes and then at 160° C. for 20 minutes, it was further heated in an atmosphere of nitrogen (with an oxygen concentration of 38%) at 270° C. for 20 minutes to obtain a polyimide-coated copper foil. The film thickness was 25 μm. The characteristics of the printed-wiring board thus obtained were as shown in Table 1.

EXAMPLE 5

In a vessel fitted with a stirrer, a reflux condenser and a nitrogen inlet tube, 31.7 g (0.08 mole) of bis[4-(3-aminophenoxy)phenyl]ketone and 24.0 g (0.12 mole) of 4,4'-diaminodiphenyl ether were dissolved in 400 ml of N-dimethylacetamide. To this solution was added 43.6 g (0.20 mole) of pyromellitic acid dianhydride under an atmosphere of nitrogen, followed by stirring for 24 hours. The polyamic acid solution thus obtained had an inherent viscosity of 1.8 dl/g. This polyamic acid solution was diluted with N,N-dimethylacetamide to a polyamic acid concentration of 13% so as to adjust its rotational viscosity to 25,000 cps. Then, using a doctor blade, an HTE electrolytic copper foil (18 μm thick; manufactured by Mitsui Metal Mining Co.) was uniformly coated with the diluted solution. After this coated copper foil was dried by heating at 130° C. for 10 minutes and then 160° C. for 10 minutes, it was further heated in an atmosphere of nitrogen (with an oxygen concentration of 3%) at 270° C. for 10 minutes to obtain a polyimide-coated copper foil. The film thickness was 25 μm. The characteristics of laminate for printed-surface board thus obtained were as shown in Table 1.

EXAMPLE 6

In a vessel fitted with a stirrer, a reflux condenser and a nitrogen inlet tube, 24.0 g (0.06 mole) of bis[4-(3-aminophenoxy)phenyl sulfide and 51.6 g (0.14 mole) of 4,4'-bis(4-aminophenoxy)biphenyl were dissolved in 420 ml of N,N-dimethylacetamide. To this solution was added 43.6 g (0.20 mole) of pyromellitic acid dianhydride under an atmosphere of nitrogen, followed by stirring for 24 hours. The polyamic acid solution thus obtained had an inherent viscosity of 2.1 dl/g. This polyamic acid solution was diluted with N,N-dimethylacetamide to a polyamic acid concentration of 12% so as to adjust its rotational viscosity to 45,000 cps. Then, using a doctor blade, an HTE electrolytic copper foil (35 μm thick; manufactured by Mitsui Metal Mining Co.) was uniformly coated with the diluted solution. After this coated copper foil was dried by heating at 130° C. for 10 minutes then 160° C. for 10 minutes, it was further heated in an atmosphere of nitrogen (with an oxygen concentration of 3%) at 270° C. for 10 minutes to obtain a polyimide-coated copper foil. The film thickness was 50 μm. The characteristics of the laminate for printed-circuit board thus obtained were as shown in Table 1.

EXAMPLE 7

A polyamic acid solution was prepared in the same manner as described in Example 6, except that 25.9 g (0.06 mole) of bis[4-(3-aminophenoxy)phenyl] sulfone was used in place of 24.0 of bis[4-(3-aminophenoxy)phenyl] sulfide. The solution so prepared had a inherent viscosity of 2.0 dl/g. This solution was diluted with N,N-dimethylacetamide to a polyamic acid concentration of 13% so as to adjust its rotational viscosity to 40,000 cps. Thereafter, the procedure of Example 6 was repeated to obtain a polyimide-coated copper foil. The characteristics of the laminate for printed-circuit board thus obtained were as shown in Table 1.

EXAMPLE 8

A polyamic acid solution was prepared in the same manner as described in Example 6, except that 31.1 g (0.06 mole) of 2,2-bis[4-(3-aminophenoxy)phenyl]-1,1,1,3,3,3-hexafluoropropane was used in place of 24.0 g of bis[4-(3-aminophenoxy)phenyl] sulfide. The solution so prepared had an inherent viscosity of 1.2 dl/g. This solution was diluted with N,N-dimethylacetamide to a polyamic acid concentration of 18% so as to adjust its rotational viscosity to 45,000 cps. Thereafter, the procedure of Example 6 was repeated to obtain a polyimide-coated copper foil. The characteristics of the laminate for printed-circuit board thus obtained were as shown in Table 1.

EXAMPLE 9

In a vessel fitted with a stirrer, a reflux condenser and a nitrogen inlet tube, 23.4 g (0.08 mole) of 1,3-bis(3-aminophenoxy)benzene was dissolved in 200 ml of N,N-dimethylacetamide. To this solution was added 25.7 g (0.08 mole) of 3,3',4,4'-benzophenonetetracarboxylic acid dianhydride under an atmosphere of nitrogen. The resulting mixture was stirred at room temperature for 24 hours to obtain a polyamic acid solution. The polyamic acid solution thus obtained had an inherent viscosity of 1.8 dl/g. This solution is hereinafter referred to as Solution A.

On the other hand, 24.0 g (0.12 mole) of 4,4'-diaminodiphenyl ether was dissolved in 250 ml of N,N-dimethylacetamide. To this solution was added 38.7 g (0.12 mole) of 3,3',4,4'-benzophenonetetracarboxylic acid dianhydride under an atmosphere of nitrogen. The resulting mixture was stirred at room temperature for 24 hours to obtain a polyamic acid solution. The polyamic acid solution thus obtained had an inherent viscosity of 1.6 dl/g. This solution is hereinafter referred to as Solution B.

Then, 59 g of Solution A was mixed with 74 g of Solution B so that thge equivalent weight ratio of the polyamic acid in Solution A to the polyamic acid in Solution B was adjusted to 40:60. The resulting solution was diluted with N,N-dimethylacetamide to a polyamic acid concentration of 14% so as to adjust its viscosity to 26,000 cps. Then, using a doctor blade, a rolled copper foil (35 μm thick) was uniformly coated with the diluted solution. This coated copper foil was dried at 150° C. for 60 minutes and then heated in an atmosphere of nitrogen (with an oxygen concentration of 3%) at 260° C. for 30 minutes to obtain a polyimide-coated copper foil. The film thickness was 25 μm. The characteristics of the laminate for printed-circuit board thus obtained were as shown in Table 1.

EXAMPLE 10

In a vessel fitted with a stirrer, a reflux condenser and a nitrogen inlet tube, 22.1 g (0.06 mole) of 4,4'-bis(3-aminophenoxy)biphenyl was dissolved in 150 ml of N,N-dimethylacetamide. To this solution was added 13.1 g (0.06 mole) of pyromellitic acid dianhydride under an atmosphere of nitrogen. The resulting mixture was stirred at room temperature for 24 hours to obtain a polyamic acid solution. The polyamic acid solution thus obtained had an inherent viscosity of 1.7 dl/g. This solution is hereinafter referred to as Solution C.

On the other hand, 28.0 g (0.14 mole) of 4,4'-diaminodiphenyl ether was dissolved in 240 ml of N,N-dimethylacetamide. To this solution was added 30.5 g (0.14 mole) of pyromellitic acid dianhydride under an atmosphere of nitrogen. The resulting mixture was stirred at room temperature for 24 hours to obtain a polyamic acid solution. The polyamic acid solution thus obtained had an inherent viscosity of 1.6 dl/g. This solution is hereinafter referred to as Solution D.

Then, 44 g of Solution C was mixed with 71 g of Solution D so that the equivalent weight ratio of the polyamic acid in Solution C to the polyamic acid in Solution D was adjusted to 30:70. The resulting solution was diluted with N,N-dimethylacetamide to a polyamic acid concentration of 15% so as to adjust its viscosity to 30,000 cps. Then, using a doctor blade, a rolled copper foil (35 μm thick) was uniformly coated with the diluted solution. This coated copper foil was dried at 150° C. for 60 minutes and then heated in an atmosphere of nitrogen (with an oxygen concentration of 3%) at 260° C. for 30 minutes to obtain a polyimide-coated copper foil. The film thickness was 25 μm. The characteristics of the laminate for printed-circuit board thus obtained were as shown in Table 1.

COMPARATIVE EXAMPLE 1

In a vessel fitted with a stirrer, a reflux condenser and a nitrogen inlet tube, 58.4 g (0.20 mole) of 1,3-bis(3-aminophenoxy)benzene was dissolved in 430 ml of N,N-dimethylacetamide. To this solution was added 64.4 g (0.20 mole) of 3,3',4,4'-benzophenonetetracarboxylic acid dianhydride under an atmosphere of nitrogen. The resulting mixture was stirred at 10° C. for 24 hours to obtain a polyamic acid solution. The polyamic acid in the solution thus obtained had an inherent viscosity of 1.4 dl/g. This polyamic acid solution was diluted with N,N-dimethylacetamide to a polyamic acid concentration of 18% so as to adjust its rotational viscosity to 27,000 cps. Then, using a doctor blade, a rolled copper foil (35 μm thick) was uniformly coated with the diluted solution. This coated copper foil was dried by heating at 130° C. for 60 minutes, and then heated in an atmosphere of nitrogen (with an oxygen concentration of 4%) at 240° C. for 60 minutes to obtain a polyimide-coated copper foil. The film thickness was 25 μm. The characteristics of the laminate for printed circuit board thus obtained were as shown in Table 2.

COMPARATIVE EXAMPLE 2

In a vessel fitted with a stirrer, a reflux condenser and a nitrogen inlet tube, 73.6 g (0.20 mole) of 4,4'-bis(4-aminophenoxy)biphenyl was dissolved in 400 ml of N,N-dimethylacetamide. After this solution was cooled to about 0° C., 43.6 g (0.20 mole) of pyromellitic acid dianhydride was added thereto under an atmosphere of nitrogen, and the resulting mixture was stirred at about 0° C. for 2 hours. Then, the mixture was returned to room temperature and stirred for about 20 hours under an atmosphere of nitrogen. The polyamic acid solution thus obtained had an inherent viscosity of 1.6 dl/g. This polyamic acid solution was diluted with N,N-dimethylacetamide to a polyamic acid concentration of 18% so as to adjust its rotational viscosity to 110,000 cps.

Then, according to a casting technique, this solution was uniformly applied to a rolled copper foil (35 μm thick). After the coated copper foil was dried by heating at 130° C. for 10 minutes and then at 160° C. for 10 minutes, it was further heated in an atmosphere of nitrogen (with an oxygen concentration of 3%) at 270° C. for 10 minutes to obtain a polyimide-coated copper foil. The film thickness was 25 μm. The characteristics of the laminate for printed-circuit board thus obtained were as shown in Table 2.

TABLE 1

| Item | Unit | Example No. 1 | 2 | 3 | 4 | 5 |
|---|---|---|---|---|---|---|
| Foil peeling strength | kgf/cm | 1.2 | 1.5 | 0.9 | 1.6 | 1.4 |
| Surface resistance | Ω | $1.3 \times 10^{16}$ | $1.8 \times 10^{16}$ | $1.5 \times 10^{16}$ | $2.0 \times 10^{16}$ | $1.3 \times 10^{16}$ |
| Resistance to soldering | — | No change | No change | No change | No change | No change |
| Resistance to manual soldering | — | | | | | |
| Folding endurance | times | 210 | 350 | 260 | 380 | 280 |
| Dielectric constant | — | 3.1 | 3.2 | 3.2 | 2.9 | 3.1 |
| Dielectric dissipation factor | — | 0.003 | 0.003 | 0.003 | 0.002 | 0.003 |

| Item | Unit | Example No. 6 | 7 | 8 | 9 | 10 |
|---|---|---|---|---|---|---|
| Foil peeling strength | kgf/cm | 1.7 | 1.5 | 1.3 | 1.0 | 1.2 |
| Surface resistance | Ω | $1.2 \times 10^{16}$ | $1.2 \times 10^{16}$ | $1.8 \times 10^{16}$ | $1.3 \times 10^{16}$ | $1.7 \times 10^{16}$ |
| Resistance to soldering | — | No change | No change | No change | No change | No change |
| Resistance to manual soldering | — | | | | | |
| Folding endurance | times | 210 | 250 | 280 | 160 | 280 |
| Dielectric constant | — | 3.2 | 3.2 | 3.0 | 3.1 | 3.2 |
| Dielectric dissipation factor | — | 0.003 | 0.003 | 0.002 | 0.003 | 0.003 |

TABLE 2

| Item | Unit | Comparative Example No. 1 | 2 |
|---|---|---|---|
| Foil peeling strength | kgf/cm | 2.1 | 0.4 |
| Surface resistance | Ω | $1.2 \times 10^{16}$ | $1.7 \times 10^{16}$ |
| Resistance to soldering | — | Slight deformation | No change |
| Resistance to manual soldering | — | X | |
| Folding endurance | times | 180 | 70 |
| Dielectric constant | — | 3.1 | 3.3 |
| Dielectric dissipation factor | — | 0.002 | 0.003 |

We claim:

1. A flexible laminate for printed-circuit board comprising a metal foil and a polyimide film directly bonded thereto, said polyimide film having been formed by mixing a symmetrical aromatic meta-substituted primary diamine selected from the group consisting of:

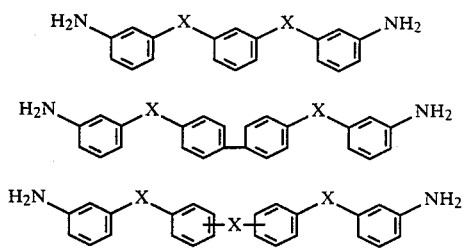

and

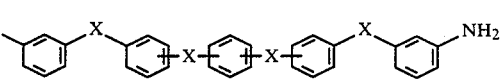

wherein X is selected from the group consisting of O, $SO_2$, S, CO, $CH_2$, $C(CH_3)_2$ and $C(CF_3)_2$, and the radicals represented by X can be the same, with a symmetrical aromatic parasubstituted primary diamine in an equivalent weight ratio of 10–60:90–40, and then reacting the resultant mixture with an aromatic tetracarboxylic acid anhydride.

2. The flexible laminate for printed-circuit board as claimed in claim 1, wherein said polyimide layer has thickness of 10 μm to 1 mm.

3. A method of making a flexible laminate for printed-circuit board as claimed in claim 1, wherein said symmetrical aromatic meta-substituted primary diamine is a compound of the formula

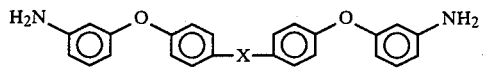

wherein X is O, SO₂, S, CO, CH₂, C(CH₃)₂, C(CF₃)₂, or a direct bond.

4. A method of making a flexable laminate for printed-circuit board as claimed in claim 3, wherein said symmetrical aromatic meta-substituted primary diamine is a compound of the formula

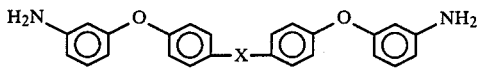

wherein X is O, SO₂, S, CO, CH₂, C(CH₃)₂, C(CF₃)₂, or a direct bond.

5. A method of making flexible laminate for printed-circuit board as claimed in claim 4, wherein said symmetrical aromatic meta-substituted primary diamine is a compound of the formula

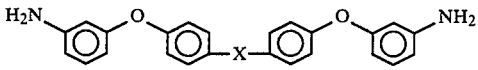

wherein X is O, SO₂, S, CO, CH₂, C(CF₃)₂, C(CF₃)₂, or a direct bond.

6. A flexible laminate for printed-circuit board comprising a metal foil and a polyimide film directly bonded thereto, said polyimide film having been formed by reacting a symmetrical aromatic meta-substituted primary diamine selected from the group consisting of:

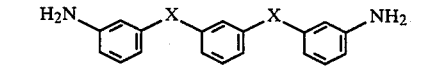

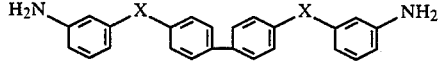

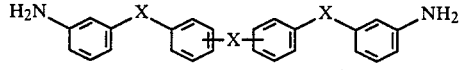

and

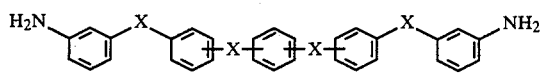

wherein X is selected from the group consisting of O, SO₂, S, CO, CH₂, C(CH₃)₂ and C(CF₃)₂, and the radical represented by X can be the same, with an aromatic tetracarboxylic acid anhydride to form a polyamic acid (A), reacting a symmetrical aromatic para-substituted primary diamine with an aromatic tetracarboxylic acid anhydride to form a polyamic acid (B), mixing said polyamic acid (A) with said polyamic acid (B) in an equivalent weight ratio of 10–60:90–40, and further reacting the resultant mixture.

7. The flexible laminate for printed-circuit board as claimed in claim 6 wherein said polyimide layer has a thickness of 10 μm to 1 mm.

8. The method of making flexible laminate for printed-circuit board as claimed in claim 7 wherein said symmetrical aromatic meta-substituted primary diamine is a compound of the formula

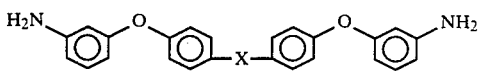

wherein X is O, SO₂, S, CO, CH₂, C(CH₃)₂, C(CF₃)₂, or a direct bond.

9. A method of making a flexible laminate for printed-circuit board which comprises the steps of mixing a symmetrical aromatic meta-substituted primary diamine selected from the group consisting of:

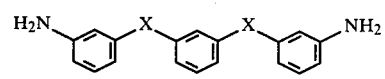

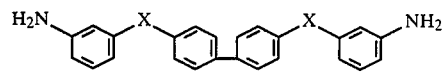

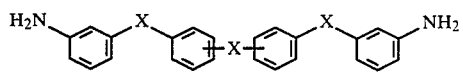

and

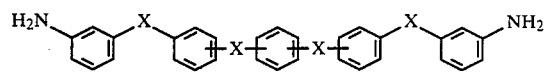

wherein X is selected from the group consisting of O, SO₂, S, CO, CH₂, C(CH₃)₂ and C(CF₃)₂, and the radicals represented by X can be the same, with a symmetrical aromatic para-substituted primary diamine in an equivalent weight ratio of 10–60:90–40, reacting the resultant mixture with an aromatic tetracarboxylic acid anhydride to form a polyamic acid as a precursor of polyimide, coating a metal foil directly with the resultant organic solvent solution of said polyamic acid, and then heating the coated metal foil to dehydrate said polyamic acid.

10. The method of making a flexible laminate for printed-circuit board as claimed in claim 9 wherein said step of heating the coated metal foil to dehydrate said polyamic acid is carried out in an atomsphere of an inert gas.

11. The method of making a flexible laminate for printed-circuit board as claimed in claim 9 wherein the substrate formed by a coating a metal foil directly with the resulting organic solvent solution of said polyamic acid is dried to a substantially tack-free state and rolled up, and the rolled substrate is heated in an atmosphere of an inert gas to remove the solvent therefrom and convert said polyamic acid to polyimide.

12. A method of making a flexible laminate for printed-circuit board which comprises the steps of reacting a symmetrical aromatic meta-substituted primary diamine selected from the group consisting of:

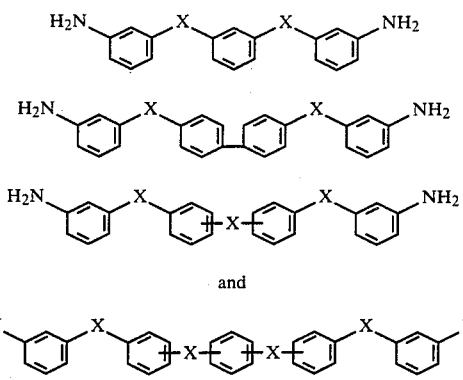

wherein X is selected from the group consisting of of O, SO$_2$, S, CO, CH$_2$, C(CH$_3$)$_2$ and C(CF$_3$)$_2$, and the radicals represented by X can be the same, with an aromatic tetracarboxylic acid anhydride to form a polyamic acid (A), reacting a symmetrical aromatic para-substituted primary diamine with an aromatic tetracarboxylic acid anhydride to form a polyamic acid (B), mixing the resultant organic solvent solution of said polyamic acid (A) with the resulting organic solvent solution of said polyamic acid (B) in an equivalent ratio of 10–60:90–40, coating a metal foil directly with the resultant mixture, and then heating the coated metal foil to dehydrate said polyamic acids.

13. A method of making a flexible laminate for printed-circuit board as claimed in claim 12 wherein said step of heating the coated metal foil to dehydrate said polyamic acids is carried out in an atmosphere of an inert gas.

14. A method of making a flexible laminate for printed-circuit board as claimed in claim 12 wherein the laminate formed by coating a metal foil directly with a mixture of the resultant organic solvent solution of said polyamic acid (A) and the resultant organic solvent solution of said polyamic acid (B) is dried to a substantially tack-free state and rolled up, and the rolled laminate is heated in an atmosphere of an inert gas to remove the solvent therefrom and convert said polyamic acids to polyimide.

* * * * *